United States Patent
Patel et al.

(10) Patent No.: US 8,749,226 B2
(45) Date of Patent: Jun. 10, 2014

(54) LINE-POWERED INSTRUMENT TRANSFORMER

(75) Inventors: Jashbhai S. Patel, Rocky Mount, NC (US); Brent J. Ackermann, Reidsville, NC (US); Steven A. Shaw, Greenville, NC (US); Thomas L. Stallings, Macclesfield, NC (US)

(73) Assignee: ABB Technology AG, Zurich (CH)

( * ) Notice: Subject to any disclaimer, the term of this patent is extended or adjusted under 35 U.S.C. 154(b) by 308 days.

(21) Appl. No.: 13/087,216

(22) Filed: Apr. 14, 2011

(65) Prior Publication Data

US 2011/0279207 A1 Nov. 17, 2011

Related U.S. Application Data

(60) Provisional application No. 61/345,502, filed on May 17, 2010.

(51) Int. Cl.
*G01R 1/20* (2006.01)
*G01R 15/18* (2006.01)
*G01R 7/00* (2006.01)

(52) U.S. Cl.
USPC .......................... 324/126; 324/127; 324/142

(58) Field of Classification Search
None
See application file for complete search history.

(56) References Cited

U.S. PATENT DOCUMENTS

| | | |
|---|---|---|
| 4,074,193 A | 2/1978 | Kohler |
| 4,384,289 A | 5/1983 | Stillwell et al. |
| 4,386,280 A | 5/1983 | Ricaud et al. |
| 4,689,752 A | 8/1987 | Fernandes et al. |
| 4,717,872 A | 1/1988 | Wagner et al. |
| 4,731,599 A * | 3/1988 | Preissinger ................. 336/84 C |
| 5,162,726 A | 11/1992 | Swanson et al. |

(Continued)

FOREIGN PATENT DOCUMENTS

| | | |
|---|---|---|
| JP | 8273951 | 10/1996 |
| WO | 2008127575 | 10/2008 |
| WO | 2009042076 | 4/2009 |
| WO | 2009137902 | 11/2009 |

OTHER PUBLICATIONS

"GridSync wireless sensors: current and voltage sensors for distribution optimization," ABB Inc. 1VAP429997-DB Rev. A Jan. 2011.

(Continued)

*Primary Examiner* — Vinh Nguyen
(74) *Attorney, Agent, or Firm* — Melissa J. Szczepanik (57) ABSTRACT

An instrument transformer for measuring properties of electricity in a power line is provided. The instrument transformer includes a cover section releasably secured to a base section. The cover section includes a first core segment encapsulated in a first encasement formed from a polymer resin. The base section includes a second core segment with a low voltage winding mounted thereto and a voltage transformer, all of which are encapsulated in a second encasement formed from a polymer resin. When the cover section and the base section are secured together, the first core segment adjoins the second core segment, thereby forming a current transformer having a core formed from the first and second core segments. A method for making the instrument transformer includes the connection of the cover section to the base section to form a passage through which a high voltage conductor may extend.

14 Claims, 5 Drawing Sheets

(56) References Cited

U.S. PATENT DOCUMENTS

| | | | |
|---|---|---|---|
| 5,381,089 A * | 1/1995 | Dickmeyer et al. | 324/174 |
| 5,426,360 A | 6/1995 | Maraio et al. | |
| 5,469,333 A * | 11/1995 | Ellerson et al. | 361/779 |
| 6,711,512 B2 | 3/2004 | Noh | |
| 6,756,776 B2 | 6/2004 | Perkinson et al. | |
| 7,557,563 B2 | 7/2009 | Gunn et al. | |
| 7,598,724 B2 | 10/2009 | Howell et al. | |
| 7,777,605 B2 * | 8/2010 | Zumoto et al. | 336/178 |
| 2009/0309754 A1 | 12/2009 | Bou et al. | |

OTHER PUBLICATIONS

"Instrument Transformers: Technical Information and Application Guide," ABB Inc. 1VAP42003-TG Dec. 2004 Rev. A (replaces TB3. 2.8-1A).

H. Höller, International Searching Authority (EPO), International Search Report and Written Opinion of the International Searching Authority for corresponding International Application No. PCT/US2011/033182, European Patent Office, mailed Oct. 19, 2011.

* cited by examiner

LINE-POWERED INSTRUMENT TRANSFORMER

CROSS-REFERENCE TO RELATED APPLICATION

This application claims the benefit of U.S. provisional patent application No. 61/345,502 filed on May 17, 2010, which is hereby incorporated by reference in its entirety.

BACKGROUND

Instrument transformers include current transformers and voltage transformers and are used to measure the properties of electricity flowing through conductors. Current and voltage transformers are used in measurement and protective applications, together with equipment, such as meters and relays. Such transformers "step down" the current and/or voltage of a system to a standardized value that can be handled by associated equipment. For example, a current transformer may step down current in a range of 10 to 2,500 amps to a current in a range of 1 to 5 amps, while a voltage transformer may step down voltage in a range of 12,000 to 40,000 volts to a voltage in a range of 100 to 120 volts. Current and voltage transformers may be used to measure current and voltage, respectively, in an elongated high voltage conductor, such as an overhead power line.

A conventional current transformer for measuring current in a high voltage conductor typically has a unitary body with an opening through which the conductor extends. Such a conventional current transformer has a unitary core, which is circular or toroidal in shape and has a central opening that coincides, at least partially, with the opening in the body. With such a construction, the current transformer is mounted to the conductor by cutting and then splicing the conductor. As can be appreciated such cutting and splicing is undesirable. Accordingly, current transformers having two-piece or split cores have been proposed. Examples of current transformers having split cores are shown in U.S. Pat. No. 4,048,605 to McCollum, U.S. Pat. No. 4,709,339 to Fernandes and US20060279910 to Gunn et al.

The present invention is directed to an instrument transformer with an improved construction, having a split core current transformer and a voltage transformer.

SUMMARY

In accordance with the present invention, an instrument transformer for measuring the properties of electricity flowing in an elongated conductor is provided. The instrument transformer includes a cover section and a base section. The cover section includes a first fastening apparatus and a first core segment of a current transformer. The first core segment has at least one end surface. A first encasement composed of a polymer resin encapsulates the first core segment except for the at least one end surface. The base section includes a second fastening apparatus, a second core segment of the current transformer, a low voltage winding disposed around the second core segment and a voltage transformer having a coil assembly mounted to a core. The second core segment has at least one end surface. A second encasement composed of a polymer resin encapsulates the low voltage winding, the voltage transformer and the second core segment except for the at least one end surface. The first and second fastening apparatuses engage each other to releasably secure the cover section to the base section and to align the first and second core segments such that when the cover section and the base section are secured together, the at least one end surface of the first core segment adjoins the at least one end surface of the second core segment, thereby forming a current transformer having a core formed from the first and second core segments.

A method of making an instrument transformer for connection to a high voltage conductor comprises providing a first core segment having at least one end surface and encapsulating the first core segment except the at least one end surface with a resin to form a first encasement. The first encasement has a generally curved first channel extending laterally through the first encasement. The method further comprises providing a second core segment having at least one end surface and mounting a low voltage winding to the second core segment. The second core segment except for the at least one end surface and the low voltage winding are encapsulated within a resin to form a second encasement. The second encasement has a generally curved second channel extending laterally through the second encasement. The first encasement is then attached to the second encasement using a plurality of bolts threadably engaged with an associated one of a plurality of bore inserts located in the first encasement. The attachment of the first encasement to the second encasement forms a passage when the first and second channels are joined together and the at least one end surface of the first and second core segments are adjoined. Further, an electrical connection between the high voltage conductor and first core segment is made by a connector disposed between and attached to the high voltage conductor and first core segment.

BRIEF DESCRIPTION OF THE DRAWINGS

In the accompanying drawings, structural embodiments are illustrated that, together with the detailed description provided below, describe exemplary embodiments of a line-powered instrument transformer. One of ordinary skill in the art will appreciate that a component may be designed as multiple components or that multiple components may be designed as a single component.

Further, in the accompanying drawings and description that follow, like parts are indicated throughout the drawings and written description with the same reference numerals, respectively. The figures are not drawn to scale and the proportions of certain parts have been exaggerated for convenience of illustration.

DETAILED DESCRIPTION

It should be noted that in the detailed description that follows, identical components have the same reference numerals, regardless of whether they are shown in different embodiments of the present invention. It should also be noted that in order to clearly and concisely disclose the present invention, the drawings may not necessarily be to scale and certain features of the invention may be shown in somewhat schematic form.

As used herein, the abbreviation "CT" shall mean "current transformer".

Figure 1:
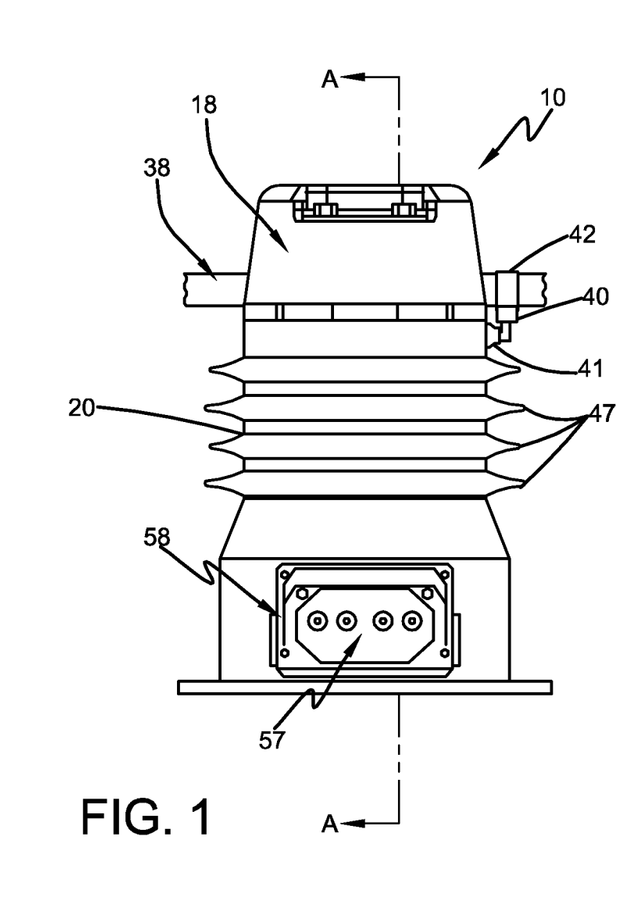
FIG. 1 is a front view of an instrument transformer embodied in accordance with the present invention.
Figure 2:
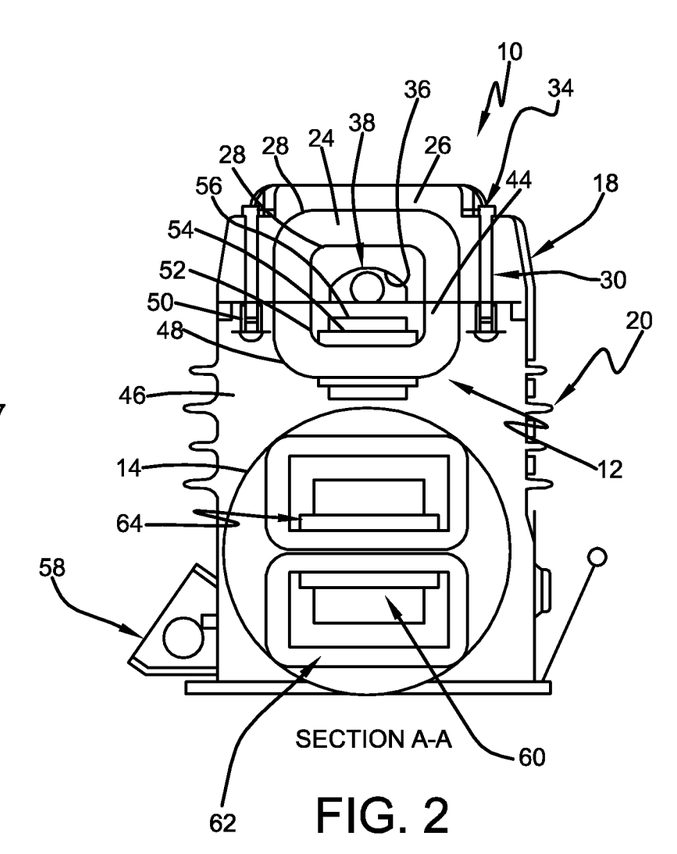
FIG. 2 is a schematic sectional view of the instrument transformer taken along line A-A in FIG. 1.

Referring now to FIGS. 1 and 2, there are shown views of an instrument transformer 10 embodied in accordance with the present invention. The instrument transformer 10 includes a current transformer 12 and a voltage transformer 14. One of ordinary skill in the art will recognize that the instrument transformer 10 may be embodied as a current transformer 12 alone. The current transformer 12 and the voltage transformer 14 are arranged in a cover section 18 and a base section 20 that are releasably secured together. The voltage transformer 14 is fully disposed in the base section 20, while the current transformer 12 is partially disposed in the cover section 18 and partially disposed in the base section 20. The current transformer 12 is operable to measure the current in a high voltage conductor (such as high voltage conductor 38), while the voltage transformer 14 is operable to measure the voltage in the high voltage conductor 38. The voltage transformer 14 also supplies power to the electronics for the instrument transformer 10.

The cover section 18 includes a top or first core segment 24 encapsulated in a top or first encasement 26 formed from one or more polymer resins in a cover casting process. The first core segment 24 is generally U-shaped and is comprised of ferromagnetic metal, such as grain-oriented silicon steel or amorphous steel. The first core segment 24 may be formed from layers of metal strips or a stack of metal plates. An electrostatic shield 28 is disposed over and covers the first core segment 24, except for the ends thereof. The electrostatic shield 28 may be formed from one or more layers of semi-conductive tape that are wound over a layer of closed cell foam padding that encompasses the first core segment 24. The first encasement 26 fully covers the first core segment 24 except for the ends thereof, which are exposed at a bottom surface of the first encasement 26. At least a portion of the bottom surface of the first encasement 26 is substantially flat (planar) so as to permit the bottom surface to be disposed flush with a top surface of a second encasement 46 of the base section 20.

A plurality of bore inserts 30 extend through the first encasement 26 from the top to the bottom thereof. The bore inserts 30 are arranged around the first core segment 24 and are adapted to receive threaded bolts 34 for securing the cover section 18 to the base section 20, as will be further described below. A main passage 36 extends laterally through the first encasement 26 and is adapted to accommodate a high voltage conductor 38, such as an overhead power line. The high voltage conductor 38 may carry electricity at a voltage from about 1 kV to about 52 kV. When the instrument transformer is installed and the high voltage conductor 38 extends through the main passage 36, a connector 40 electrically connects the un-insulated high voltage conductor 38 to the first core segment 24 and the second core segment so that the first core segment 24, second core segment 44, connector 40, and threaded bolts 34, are at about the same potential as the high voltage conductor 38.

The advantage of having the aforementioned components at nearly the same potential as the un-insulated high voltage conductor 38 is that insulation which would otherwise be required to maintain the first and second core segments 24, 44 at ground potential, is not necessary. Therefore, the gap between the first and second core segments 24, 44 will not be widened by the usage of insulation around the high voltage conductor 38, and the associated ends of the first and second core segments 24, 44 will be in closer contact. The closer contact of the first and second core segments 24, 44, allowed by the absence of insulation on the high voltage conductor 38, provides increased accuracy of load current measurement. Consequently, the instrument transformer 10 is able to achieve a measurement accuracy that meets metering class.

The connector 40 may be connected to a terminal 41 mounted on the outside of the first encasement 26 and the terminal 41 may then be electrically connected to the first core segment 24 by an internal conductor. The connector 40 may be connected to the high voltage conductor 38 by a clamp 42.

The base section 20 includes a bottom or second core segment 44 encapsulated in a bottom or second encasement 46 formed from one or more polymer resins in a base casting process. The second encasement 46 has a plurality of circumferentially-extending sheds 47. The second core segment 44 is also generally U-shaped and has the same construction as the first core segment 24. In one embodiment, the first and second core segments 24, 44 are produced by constructing a single core and then cutting the core in half. The second encasement 46 fully covers the second core segment 44 except for the ends thereof, which are exposed at a top surface of the second encasement 46. At least a portion of the top surface of the second encasement 46 is substantially flat (planar) so as to permit the top surface to be disposed flush with the bottom surface of the first encasement 26 of the cover section 12. When the cover section 12 is secured to the base section 20, the exposed ends of the first and second core sections 24, 44 abut each other, thereby forming (or re-forming) a core of the current transformer 12.

The second core segment 44 is supported on a cradle 48 having a C-shaped middle section and opposing peripheral flanges. The cradle 48 is formed from an epoxy resin or any material having similar properties. Mounts 50 are secured to the flanges and have threaded interiors for threadably receiving ends of the bolts 34 extending through the bore inserts 30. A layer of closed cell foam padding, an insulation tube 52 and a low voltage winding 54 are disposed over the second core segment 44 and the middle section of the cradle 48, with the closed cell foam padding being disposed over the second core segment 44 and the insulation tube 52 being disposed between the layer of closed cell foam padding and the low voltage winding 54. The insulation tube 52 is composed of a dielectric material and electrically insulates the low voltage winding 54 from the second core segment 44. The insulation tube 52 may be comprised of a dielectric resin (such as an epoxy resin), layers of an insulating tape or a phenolic kraft paper tube (i.e., a kraft paper tube impregnated with a phenolic resin). The low voltage winding 54 is wound around the insulation tube 52 and is comprised of a plurality of turns of a conductor composed of a metal, such as copper. An electrostatic shield 56 is disposed over and covers the low voltage winding 54. The electrostatic shield 56 may be formed from one or more layers of semi-conductive tape that are wound over the low voltage winding 54. The cradle 48, the insulation tube 52 and the low voltage winding 54 are all encapsulated in the second encasement 46.

The low voltage winding 54 may have a single CT ratio or multiple CT ratios. In this regard, it should be noted that a CT ratio is the ratio of the rated primary current (in the high voltage conductor 38) to the rated secondary current (in the low voltage winding 54). If the low voltage winding 54 has a multi-ratio construction, different combinations of taps may provide a range of CT ratios, such as from 50:5 to 600:5 or from 500:5 to 4000:5. The taps are connected at different points along the travel of the conductor of the low voltage winding 54. For example, if there are five taps, two of the taps may be connected at opposing ends of the low voltage winding 54 and the other three taps may be connected to the low voltage winding 54 in between the two end taps in a spaced apart manner. Thus, the number of turns of the low voltage winding 54 between different pairs of taps is different, thereby creating different CT ratios. The taps on the low voltage winding 54 are connected by conductors to terminals 57 enclosed in a junction box 58 secured to the base section 20.

The voltage transformer 14 includes a winding structure 60 mounted to a core 62 comprised of ferromagnetic metal, such as grain-oriented silicon steel or amorphous steel. As shown, the core 62 may be comprised of two, abutting rings, each of which is formed from layers of metal strips or a stack of metal plates. The winding structure 60 is mounted to abutting legs of the rings. An insulation tube 64 is mounted to the core 62, between the core 62 and the winding structure 60. The insulation tube 64 may be comprised of a dielectric resin (such as an epoxy resin), layers of an insulating tape or a phenolic kraft paper tube.

The winding structure 60 comprises a low voltage winding concentrically disposed inside a high voltage winding. The low voltage winding and the high voltage winding are each comprised of a plurality of turns of a conductor composed of a metal, such as copper. Of course, the number of turns in the two windings is different. As with the current transformer 12, the core 62 and the winding structure 60 of the voltage transformer 14 are each covered with an electrostatic shield, which may have the same construction/composition as the electrostatic shields 28, 56. The high voltage winding of the winding structure 60 is electrically connected to the high voltage conductor 38. The connection may be through the terminal 41 and the first core segment 24. The voltage transformer 14 is operable to step down the voltage supplied to the high voltage winding (e.g., about 1-35 kV) to a lower voltage at the output of the low voltage winding. This lower voltage may be about 110-120 volts, or even lower, down to a voltage of about 10 volts. The output of the low voltage winding is connected to the terminals 57 in the junction box 58. The terminals 57 include terminals for the current measurement output(s) from the current transformer 12 and terminals for the voltage measurement output from the low voltage winding of the voltage transformer 14. The lower voltage power from the voltage transformer 14 is also used to power the electronics in a control box 100 mounted separately from the instrument transformer 10.

Figure 3:
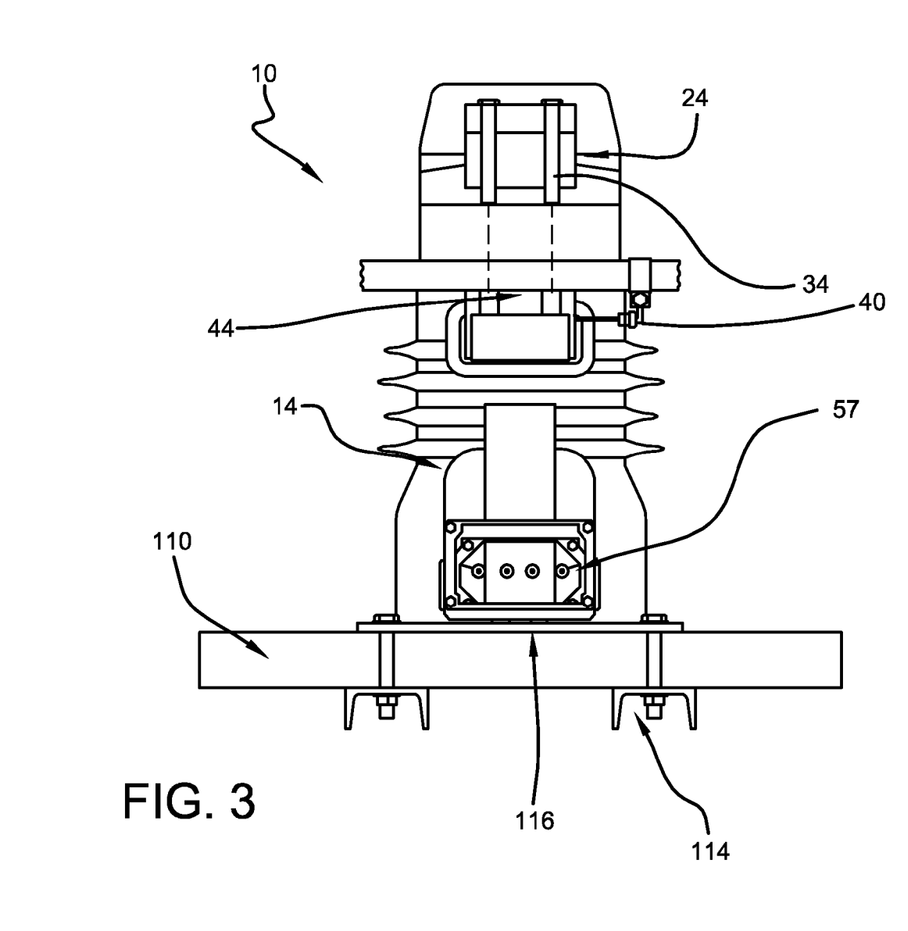
FIG. 3 is a front view of the instrument transformer mounted to a cross bar of a utility pole, with a cover section of the instrument transformer spaced above a base section of the instrument transformer and with encasements of the cover and base sections shown in phantom.
Figure 4:
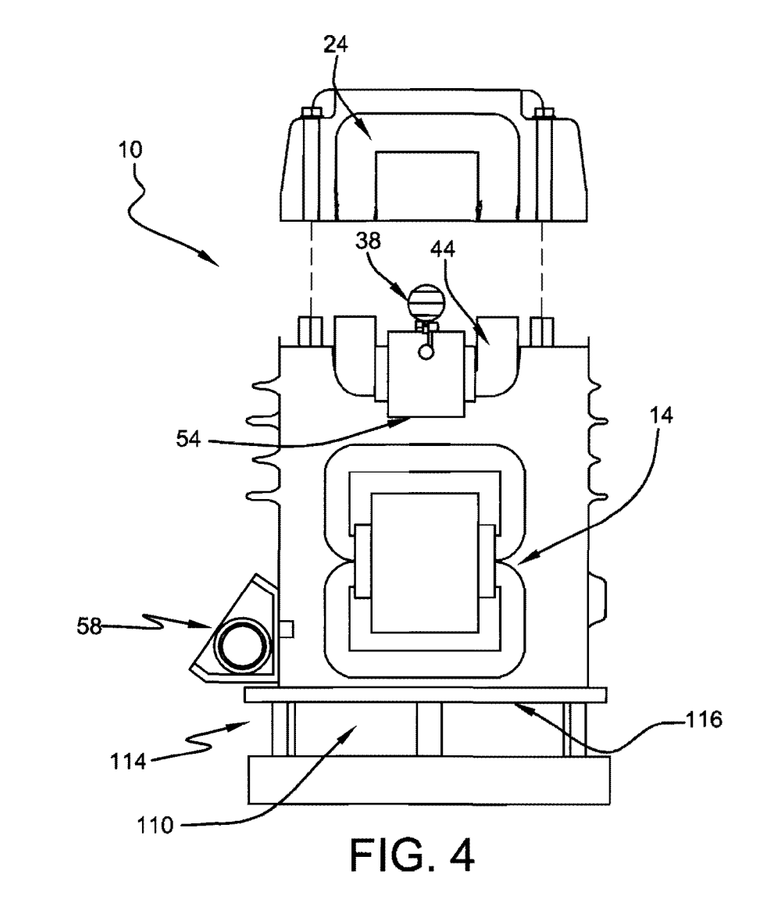
FIG. 4 is a side view of the instrument transformer mounted to the cross bar of the utility pole, with the cover section of the instrument transformer spaced above the base section of the instrument transformer and with the encasements of the cover and base sections shown in phantom.

The cover section 18 is secured to the base section 20 by inserting the bolts 34 through the bore inserts 30 of the cover section 18 and threadably securing the ends of the bolts 34 in the mounts 50 of the base section 20. The bore inserts 30 in the cover section 18 and the mounts of the base section 20 are positioned so as to properly align the first core segment 24 with the second core segment 44 to form a contiguous core for the current transformer 12 when the cover section 18 and the base section 20 are secured together with the bolts 34. The first encasement 26 and the second encasement 46 may also be formed with corresponding structural features (such as ridges and grooves and holes and posts) that help properly align the cover section 18 and the base section 20.

Figure 6:
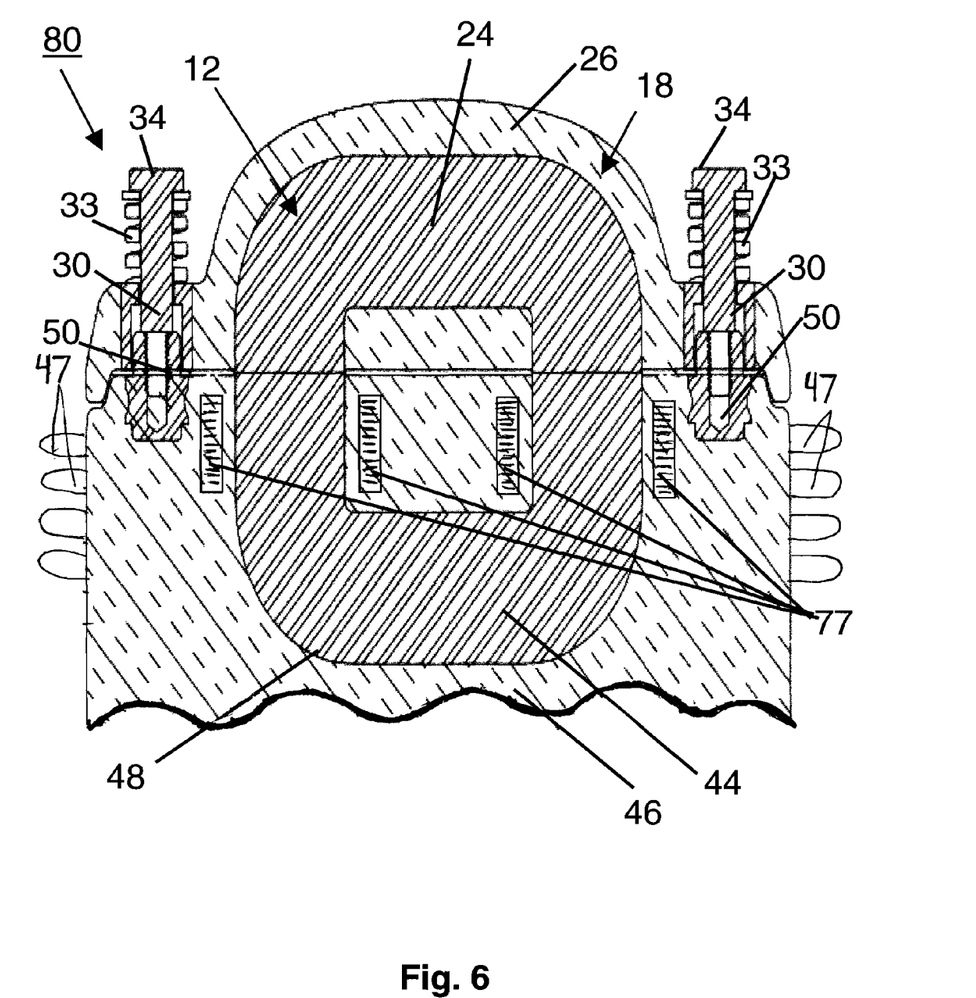
FIG. 6 is a sectional view of a current transformer embodied in accordance with the present invention.

Referring now to FIG. 6, a current transformer 80 is depicted and has the same construction as the instrument transformer 10, except as described below. The voltage transformer 14 included in the instrument transformer 10 is not part of the current transformer 80. Additionally, the current transformer 80 has two low voltage windings 77 that are arranged in a different configuration than the single low voltage winding 54 of the instrument transformer 10. Each of the low voltage windings 77 in the current transformer 80 are mounted to an associated one of opposing ends of the second core segment. The low voltage windings 77 may be connected together in series and further connected to a terminal (not shown).

Referring now to FIGS. 2 and 6, a spring mechanism 33 may be utilized to regulate the force applied to the ends of the first and second core segments 24, 44 when the cover section 18 is secured to the base section 20. The spring mechanism 33 provides the control that is required to maintain the ends of the first and second core segmented 24, 44 in full and even contact. The spring mechanism 33 is placed between the head of the threaded bolt 34 and the outer edge portion of the bore insert 30 as the threaded bolt 34 is engaged with the bore insert 30. The spring mechanism 33 may be embodied as a die spring, urethane spring, a plurality of Belleville washers, or a similar spring mechanism. When the spring mechanism 33 is embodied as a plurality of Belleville washers, the washers may be stacked in a formation having the cup end portion of each washer arranged opposite to the cup end portions of adjacent washers, the cup end portions of all washers arranged in the same direction, or a combination of the two formations. As will be appreciated by one having ordinary skill in the art, the spring mechanism 33 may be used in an embodiment having only a current transformer 12 in addition to the instrument transformer 10 comprised of both a current transformer 12 and a voltage transformer 14.

The cover section 18 may be removed from the base section 20 to permit the instrument transformer 10 to be installed to or uninstalled from the high voltage conductor 38, i.e., to pass the high voltage conductor 38 through the current transformer 12 or remove the high voltage conductor 38 from the current transformer 12. The cover section 18 is removed simply by unthreading the bolts 34 from the mounts 50, removing the spring mechanism 33, if present, and separating the cover section 18 from the base section 20.

The first and second encasements 26, 46 are formed separately in the cover casting process and the base casting process, respectively. Each of the first and second encasements 26, 46 may be formed from a single insulating resin, which is an epoxy resin. In one embodiment, the resin is a cycloaliphatic epoxy resin, still more particularly a hydrophobic cycloaliphatic epoxy resin composition. Such an epoxy resin composition may comprise a cycloaliphatic epoxy resin, a curing agent, an accelerator and filler, such as silanised quartz powder, fused silica powder, or silanised fused silica powder. In one embodiment, the epoxy resin composition comprises from about 50-70% filler. The curing agent may be an anhydride, such as a linear aliphatic polymeric anhydride, or a cyclic carboxylic anhydride. The accelerator may be an amine, an acidic catalyst (such as stannous octoate), an imidazole, or a quaternary ammonium hydroxide or halide.

The cover casting process and the base casting process may each be an automatic pressure gelation (APG) process. In such an APG process, the resin composition (in liquid form) is degassed and preheated to a temperature above 40° C., while under vacuum. The internal components of the section being cast (such as the first core segment 24 and the bore inserts 30 in the cover section 18) are placed in a cavity of a mold heated to an elevated curing temperature of the resin. The degassed and preheated resin composition is then introduced under slight pressure into the cavity containing the internal components. Inside the cavity, the resin composition quickly starts to gel. The resin composition in the cavity, however, remains in contact with pressurized resin being introduced from outside the cavity. In this manner, the shrinkage of the gelled resin composition in the cavity is compensated for by subsequent further addition of degassed and preheated resin composition entering the cavity under pressure. After the resin composition cures to a solid, the encasement with the internal components molded therein is removed from the mold cavity. The encasement is then allowed to fully cure.

It should be appreciated that in lieu of being formed pursuant to an APG process, the first and second encasements 26, 46 may be formed using an open casting process or a vacuum casting process. In an open casting process, the resin composition is simply poured into an open mold containing the internal components and then heated to the elevated curing temperature of the resin. In vacuum casting, the internal components are disposed in a mold enclosed in a vacuum chamber or casing. The resin composition is mixed under vacuum and introduced into the mold in the vacuum chamber, which is also under vacuum. The mold is heated to the elevated curing temperature of the resin. After the resin composition is dispensed into the mold, the pressure in the vacuum chamber is raised to atmospheric pressure for curing the proto-encasement in the mold. Post curing can be performed after demolding the proto-encasement.

In another embodiment of the present invention, each of the first and second encasements 26, 46 has two layers formed from two different insulating resins, respectively, and is constructed in accordance with PCT Application No.: WO2008127575, which is hereby incorporated by reference. In this embodiment, the encasement comprises an inner layer or shell and an outer layer or shell. The outer shell is disposed over the inner shell and is coextensive therewith. The inner shell is more flexible (softer) than the outer shell, with the inner shell being comprised of a flexible first resin composition, while the outer shell being comprised of a rigid second resin composition. The first resin composition (when fully cured) is flexible, having a tensile elongation at break (as measured by ASTM D638) of greater than 5%, more particularly, greater than 10%, still more particularly, greater than 20%, even still more particularly, in a range from about 20% to about 100%. The second resin composition (when fully cured) is rigid, having a tensile elongation at break (as measured by ASTM D638) of less than 5%, more particularly, in a range from about 1% to about 5%. The first resin composition of the inner shell may be a flexible epoxy composition, a flexible aromatic polyurethane composition, butyl rubber, or a thermoplastic rubber. The second resin composition of the outer shell is a cycloaliphatic epoxy composition, such as that described above. The encasement is formed over the internal components using first and second casting processes. In the first casting process, the inner shell is formed from the first resin composition in a first mold. In the second casting process, the intermediate product comprising the internal components inside the inner shell is placed in a second mold and then the second resin composition is introduced into the second mold. After the second resin composition (the outer shell) cures for a period of time to form a solid, the encasement with the internal components disposed therein is removed from the second mold. The outer shell is then allowed to fully cure.

Figure 5:
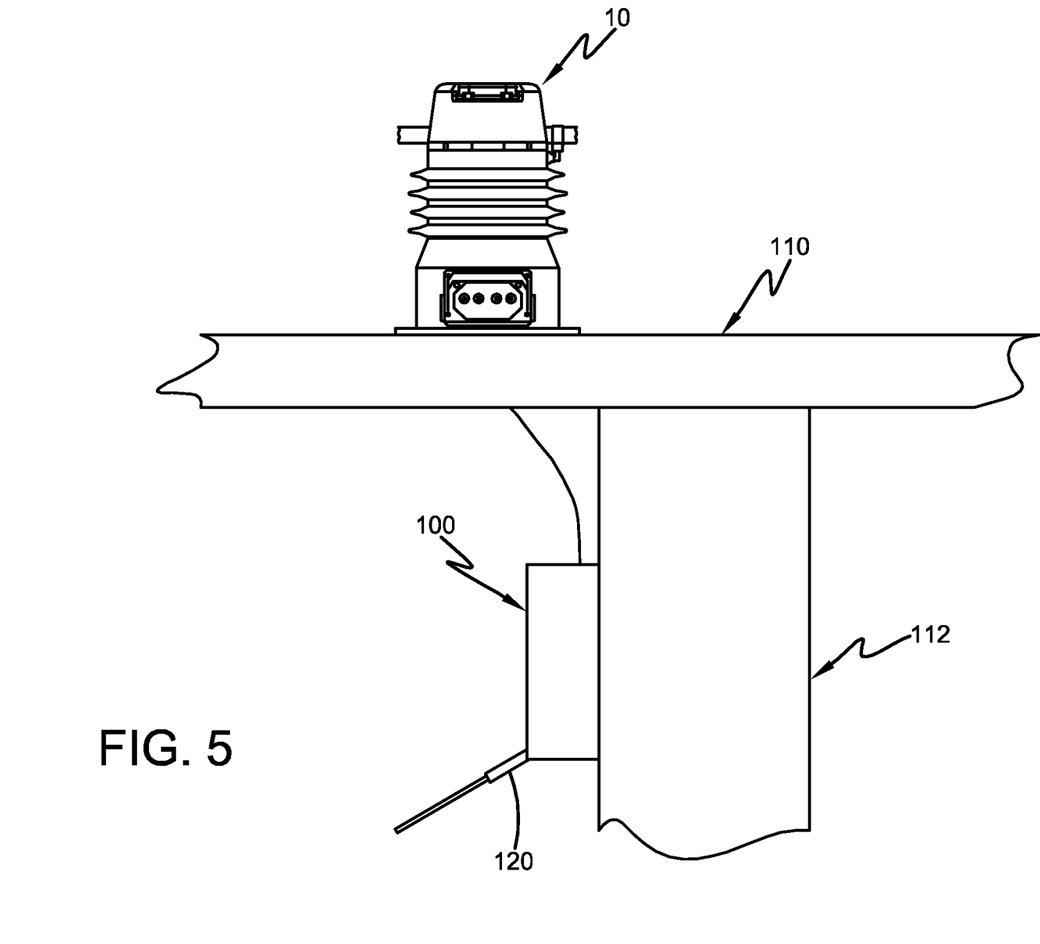
FIG. 5 is a schematic view of the instrument transformer and a control box mounted to the utility pole.

Referring now to FIGS. 3-5, the instrument transformer 10 may be mounted to a cross bar 110 of a utility pole 112 by a mounting assembly 114, which includes a mounting plate 116 secured to a bottom end of the base section 20. The control box 100 may be mounted to the utility pole 112, below the instrument transformer 10. The control box 100 contains electronics for processing and then communicating the current and voltage measurement values received from the current transformer 12 and the voltage transformer 14, respectively. The electronics includes a processor, memory and a communication port. The electronics are operable to communicate current and voltage measurement signals through the communication port over a communication link to another location, which may be nearby, such as the base of the utility pole to which the instrument transformer 10 and the control box 100 are mounted. Alternately and/or additionally, the current signal values may be transmitted to a remotely located control center. The communication link may be a physical hardwired link, a satellite link, a cellular link, a modem or telephone line link, an Internet link, a wide area or local area network link, a wireless link and combinations of the foregoing. In one embodiment, the communication link is a wireless link for communicating to a nearby location. In this embodiment, the communication port includes a radio transceiver connected to an antenna 120 mounted to the exterior of the control box 100.

It is to be understood that the description of the foregoing exemplary embodiment(s) is (are) intended to be only illustrative, rather than exhaustive, of the present invention. Those of ordinary skill will be able to make certain additions, deletions, and/or modifications to the embodiment(s) of the disclosed subject matter without departing from the spirit of the invention or its scope, as defined by the appended claims.

What is claimed is:

1. An instrument transformer for measuring properties of electricity flowing in an elongated conductor, the instrument transformer comprising:

(a.) a cover section comprising:
    a first core segment of a current transformer having at least one end surface;
    a first encasement composed of a polymer resin, the first encasement encapsulating the first core segment except for the at least one end surface; and
    a first fastening apparatus;

(b.) a base section comprising:
    a second core segment of the current transformer having at least one end surface;
    a low voltage winding disposed around the second core segment of said current transformer;
    a voltage transformer comprising a coil assembly mounted to a core, said coil assembly comprising a high voltage winding and a low voltage winding, said voltage transformer low voltage winding connected to a terminal for outputting electrical property measurements of said elongated conductor;
    a second encasement composed of a polymer resin, the second encasement encapsulating the current transformer low voltage winding, the voltage transformer including the coil assembly and the second core segment except for the at least one end surface; and
    a second fastening apparatus; and wherein the first and second fastening apparatuses are adapted to engage each other to releasably secure the cover section to the base section and to align the first and second core segments such that when the cover section and the base section are secured together, the at least one end surface of the first core segment adjoins the at least one end surface of the second core segment, thereby forming a current transformer having a core formed from the first and second core segments; wherein said elongated conductor is located between said first core segment and said second core segment.

2. The instrument transformer of claim 1, wherein when the first and second fastening apparatuses are disengaged, the cover section and the base section may be separated from each other.

3. The instrument transformer of claim 2, wherein the first and second encasements are formed in separate casting processes.

4. The instrument transformer of claim 3, wherein the first and second encasements are comprised of an epoxy resin.

5. The instrument transformer of claim 4, wherein the epoxy resin is a cycloaliphatic epoxy resin.

6. The instrument transformer of claim 2, wherein the first encasement has a first surface through which the at least one end surface of the first core segment is exposed, and wherein the second encasement has a second surface through which the at least one end surface of the second core segment is exposed.

7. The instrument transformer of claim 6, wherein at least a portion of the first surface is planar and at least a portion of the second surface is planar, and wherein the planar portions of the first and second surfaces adjoin each other when the cover section is secured to the base section.

8. The instrument transformer of claim 1, wherein the first and second fastening apparatuses comprise bolts with threaded ends and mounts for threadably receiving the ends of the bolts.

9. The instrument transformer of claim 8, wherein the first and second fastening apparatuses are further comprised of a spring mechanism disposed between a head of said bolt and an outer edge portion of said mount.

10. The instrument transformer of claim 9, wherein the spring mechanism is selected from the group consisting of a urethane spring, Belleville washers, and a die spring.

11. A method of making an instrument transformer for connection to a high voltage conductor, comprising:
   a. providing a first core segment having at least one end surface;
   b. encapsulating the first core segment except for at least one end surface with a polymer resin to form a first encasement, said first encasement having a generally arcuate first channel extending laterally through said first encasement;
   c. providing a second core segment having at least one end surface;
   d. mounting a low voltage winding to the second core segment;
   e. encapsulating said second core segment except for at least one end surface and said low voltage winding within a polymer resin to form a second encasement, said second encasement having a generally arcuate second channel extending laterally through said second encasement; and
   f. attaching said first encasement to said second encasement using a plurality of bolts threadably engaged with an associated one of a plurality of bore inserts, said plurality of bore inserts located in said first encasement, the attachment of said first encasement to said second encasement thereby adjoining the at least one end surface of the first core segment with the at least one end surface of the second core segment and forming a passage from the cooperation of said first and second channels; and
   g. providing an electrical connection between said high voltage conductor and said first core segment using a connector disposed between and attached to said high voltage conductor and said first core segment; wherein said high voltage conductor is located between said first core segment and said second core segment.

12. The method of claim 11 further comprising: g. placing a spring mechanism between a bolt head and a bore insert of said first encasement.

13. The method of claim 12 wherein the spring mechanism is selected from the group consisting of a urethane spring, Belleville washers and a die spring.

14. The method of claim 11 further comprising: g. positioning said first encasement or said second encasement relative to said high voltage conductor so that said high voltage conductor extends through one of said first and second channels and wherein the attachment of said first encasement to said second encasement is performed after the positioning of said first or said second encasement so that said high voltage conductor extends through said passage after said first and second encasements are attached.

* * * * *